United States Patent [19]

Kattleman

[11] Patent Number: 5,011,012
[45] Date of Patent: Apr. 30, 1991

[54] TOLERANCE COMPENSATING END PLUG

[75] Inventor: Harry C. Kattleman, Tempe, Ariz.

[73] Assignee: Motorola, Inc., Schaumburg, Ill.

[21] Appl. No.: 509,264

[22] Filed: Apr. 16, 1990

[51] Int. Cl.$^5$ .............................................. B65D 85/30
[52] U.S. Cl. ...................................... 206/328; 206/334
[58] Field of Search ................................ 206/328, 334

[56] References Cited

U.S. PATENT DOCUMENTS

| 4,592,481 | 6/1986 | Chen | 206/328 |
| 4,598,820 | 7/1986 | Murphy | 206/328 |
| 4,655,364 | 4/1987 | Swapp et al. | 206/328 |
| 4,685,562 | 8/1987 | Swain | 206/328 |
| 4,836,371 | 6/1989 | Long et al. | 206/328 |
| 4,899,876 | 2/1990 | Murphy et al. | 206/328 |

FOREIGN PATENT DOCUMENTS

| 0038179 | 10/1981 | European Pat. Off. | 206/328 |
| 3539446 | 7/1986 | Fed. Rep. of Germany | 206/328 |
| 8501400 | 12/1986 | Netherlands | 206/328 |
| 2112753 | 7/1983 | United Kingdom | 206/328 |

Primary Examiner—Jimmy G. Foster
Attorney, Agent, or Firm—Joe E. Barbee

[57] ABSTRACT

An end plug for a semiconductor device shipping rail has a unitary tolerance compensating portion. The tolerance compensating portion is preferably an end of the end plug which comes in contact with semiconductor devices located within a shipping rail or carrier. The end plug is dimensioned in a manner to provide a friction fit within the shipping rail, and in a preferred embodiment the tolerance compensating end has a hollow portion so that the end of the end plug that contacts the semiconductor devices can easily flex to compensate for stacking tolerance buildup and to act as a shock absorber.

4 Claims, 1 Drawing Sheet

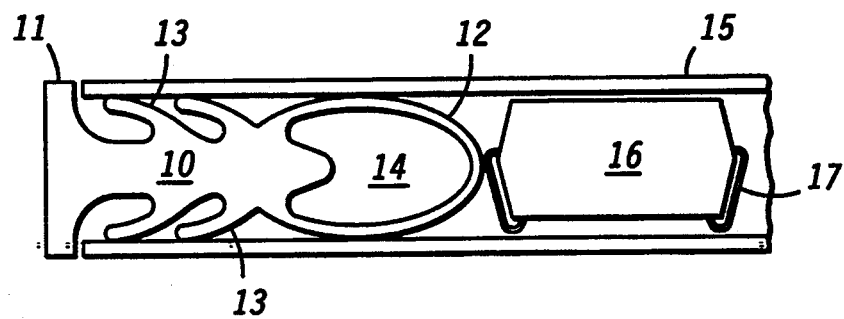
FIG. 1
FIG. 2
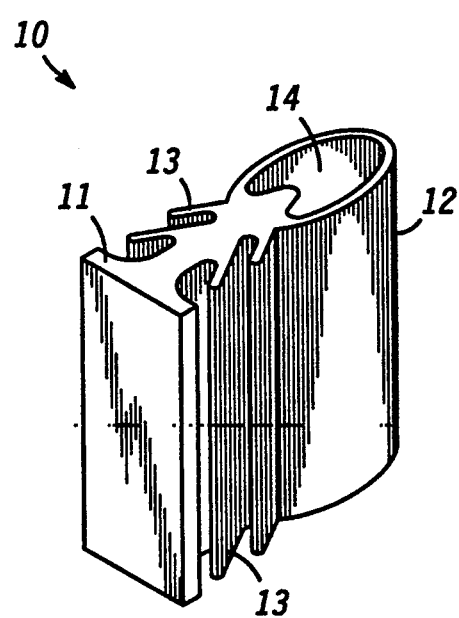

TOLERANCE COMPENSATING END PLUG

BACKGROUND OF THE INVENTION

This invention relates, in general, to semiconductor devices and more particularly, to an end plug for a shipping rail or carrier used in transporting semiconductor devices.

Typically semiconductor devices are transported in long tubular rails or carriers. The semiconductor devices are inserted through open ends of the tubular rails. In the past, the openings in the ends of the tubular rails were blocked by a pin which was inserted through the top of the rail. More recently with the widespread use of surface mounted devices the ends of the rails have been blocked by the use of a plug which is inserted into the tubular end of the rail. The plug forms a friction fit with the inside walls of the tubular rail so that it does not accidentally fall out. However, a problem arises due to the fact that there can be a buildup of tolerance of the length of the semiconductor devices. Therefore, with the tolerance buildup there may be a space or gap remaining between the end of the plug and the first semiconductor device which is adjacent to the plug. When this occurs the leads of the semiconductor device can become bent due to inertial impact against the plug caused by the semiconductor devices sliding within the rail or carrier. On the other hand, if the tolerance of the semiconductor devices is on the plus side the total length of the devices can encroach upon the space available for the plug and then when the plug is inserted into the tubular rail the leads of the semiconductor devices are damaged just from the insertion of the end plug into the tubular rail.

One attempt at solving the damaged lead problem was to insert a small piece of foam rubber pad into the tube or cavity of the rail and then to provide a vertical pin through the rail in order to retain the foam rubber pad along with the semiconductor devices. Another approach was to use an accordion design to provide a mechanism to compensate for the tolerance buildup problem. The accordion design approach was not very satisfactory due to the accordion portion of the plug folding against a wall of the rail or carrier and locking in place thus preventing the accordion plug from performing its desired function.

Accordingly, it is an object of the present invention to provide an improved end plug for a semiconductor carrier having unitary tolerance compensating means.

Another object of the present invention is to provide a tolerance compensating end plug which eliminates the need for additional packing material in the semiconductor device rail.

A further object of the present invention is to provide a tolerance compensating end plug which provides a cushion for the leads of a semiconductor device during transit in a shipping rail or carrier.

SUMMARY OF THE INVENTION

The above and other objects and advantages of the present invention are provided by a semiconductor device carrier end plug having unitary resilient biasing means. The end plug has a first end which is larger than an opening of the semiconductor device carrier. The opening of the semiconductor device carrier is used to insert the semiconductor devices into the carrier. The end plug has a body which provides a friction fit with the inside of the semiconductor device carrier. The end plug has a second end which is adjacent to the semiconductor devices within the semiconductor device carrier. The second end has tolerance compensating means which are unitary with the body of the end plug. The tolerance compensating means compensates for tolerance variations in the length of the semiconductor devices themselves. The tolerance compensating means provides a cushion for the semiconductor devices to prevent damaging the leads of the devices during transport in the semiconductor carrier or rail.

BRIEF DESCRIPTION OF THE DRAWINGS

FIG. 1 is a cross-sectional view of a portion of an end of a semiconductor device carrier illustrating the present invention in use; and FIG. 2 is an isometric view of the end plug of the present invention.

DETAILED DESCRIPTION OF THE DRAWINGS

Many semiconductor devices are transported in shipping rails or carriers which resemble a sleeve or a tubular constructed container. FIG. 1 is a cross-sectional view of one such semiconductor device carrier 15. FIG. 1 illustrates only an end portion of such a carrier 15. Carrier 15 has an opening through which semiconductor devices 16 are inserted into carrier 15. The opening in carrier 15 is blocked by an end plug 10. End plug 10 has a first end 11 and a second end 12 connected by a body portion having a plurality of fins 13. End 11 is larger than the opening of carrier 15 in order to prevent end plug 10 from being completely inserted into carrier 15. The body of end plug 10 is illustrated as having a total of four fins 13. Fins 13 provide a friction fit against the inside walls of carrier 15 to prevent end plug 10 from accidentally being dislodged from the end of carrier 15 and to hold end plug 10 in place.

End 12 of end plug 10 has a hollow portion in order to provide tolerance compensating means or resilient biasing means for end plug 10. Hollow portion 14 allows end 12 to easily flex towards the body of end plug 10. In a preferred embodiment end plug 10 is made slightly longer than necessary to mate against lead 17 of semiconductor device 16. This extra length will assure that semiconductor devices 16 within carrier 15 will be held firmly in place without any space between semiconductor devices 16 and end 12. In those cases where the tolerances of semiconductor devices 16 accrue to occupy more space within carrier 15, end 12 will flex or compress towards the body of end plug 10 thereby firmly holding semiconductor devices 16 within carrier 15. In addition, if the sum of the tolerances of semiconductor devices 16 are on the minus side, end 12 will serve as a shock absorber should semiconductor devices 16 be forced against end 12 while in transit. Typically, semiconductor devices 16 are small in size with a plurality of leads 17 surrounding the perimeter of semiconductor device 16. It is important that leads 17 are not bent or misaligned.

FIG. 2 illustrates an isometric view of end plug 10. First end 11 of plug 10 can be of any convenient shape to prevent end plug 10 from being easily inserted in its entirety into carrier 15 (FIG. 1). In addition, the body portion of end plug 10 may contain any number of fins 13 or may be of any convenient shape to make contact with inside walls of carrier 15 and to provide the necessary friction to hold plug 10 in place. Hollow portion 14 along with end 12 distributes forces against end 12 in a circular or arched manner thus absorbing tolerance variations and shock. Prior end plugs had a solid end or tip which did not absorb shock or provide tolerance variations for semiconductor devices 16. End plug 10 compensates for stack-up tolerance variations of semiconductor devices 16. End plug 10 can be molded or extruded of any suitable resilient material. The tolerance compensating means provided by end 12 collapses as needed to provide cushioning and yet provides the rigidity to prevent the semiconductor devices from sliding inside of rail 15 during transit thus preventing damage to semiconductor devices 16 and leads 17.

Hollow end 12 can be easily adapted to any current or future end plug design. End plug 10 holds semiconductor products in shipping rails or carriers in a secure manner. In addition, end plug 10 requires minimal labor to insert into a shipping rail or carrier and readily compensates for stacking tolerances of the product within the shipping rail. The compensating means of end plug 10 being integral with the end plug itself eliminates the need for additional packing material such as foam rubber inside the shipping rail.

I claim:

1. A tolerance compensating end plug for use in a semiconductor device carrier, comprising: an elongated configuration having a first end, a body, and a second end, the first end being larger than the body so that the first end engages the semiconductor device carrier on its outside to prevent the first end from being inserted into the carrier, the body being large enough to provide a friction fit with the carrier's inside, and the second end having tolerance compensating means to compensate for variations in length of semiconductor devices located inside the carrier wherein the second end and its tolerance compensating means are unitary with the body and the first end said first end defining a cross-sectional area extending outwardly and transversely from said body in opposite directions, said body including resilient fins at an acute angle with the elongated direction of the body, said second end being hollow.

2. The combination of a tolerance compensating end plug plugging up an end of a semiconductor device carrier, the semiconductor device carrier being tubular in configuration and having an inside shaped to accommodate semiconductor devices, the tolerance compensating end plug, comprising: a first end and a second end, and a body portion located between the first and second ends; the first end being transversely larger than the inside of the semiconductor device carrier preventing any portion of the first end from entering the inside of the semiconductor device carrier; the body portion being large enough to provide a resilient friction fit with the inside of the semiconductor device carrier; and the second end being adopted to be resiliently longitudinally deformed to serve as a shock absorber for semiconductor devices located within the semiconductor device carrier and to compensate for tolerance differences of lengths of the semiconductor devices.

3. The tolerance compensating end plug of claim 2 wherein the body portion has fins extending at an acute angle toward the first end.

4. The tolerance compensating end plug of claim 2 wherein the second end is a hollow, flexible head.

* * * * *